United States Patent [19]

Weinholt

[11] Patent Number: 5,751,187

[45] Date of Patent: May 12, 1998

[54] METHOD AND DEVICE FOR PHASE-MODULATED SIGNALS

[75] Inventor: Dan Rutger Weinholt, Västra Frölunda, Sweden

[73] Assignee: Telefonaktiebolaget LM Ericsson, Stockholm, Sweden

[21] Appl. No.: 765,405

[22] PCT Filed: May 22, 1996

[86] PCT No.: PCT/SE96/00664

§ 371 Date: Jan. 8, 1997

§ 102(e) Date: Jan. 8, 1997

[87] PCT Pub. No.: WO96/37987

PCT Pub. Date: Nov. 28, 1996

[30] Foreign Application Priority Data

May 22, 1995 [SE] Sweden ................... 9501892

[51] Int. Cl.[6] ................... H03D 3/00; H03D 3/02
[52] U.S. Cl. ................... 329/304; 329/306; 329/345; 329/346
[58] Field of Search ................... 329/304, 306, 329/345, 346

[56] References Cited

U.S. PATENT DOCUMENTS

| | | |
|---|---|---|
| 4,091,331 | 5/1978 | Kaser et al. ................... 329/110 |
| 4,540,948 | 9/1985 | Ryu ................... 329/122 |
| 5,027,532 | 7/1991 | Goode . |
| 5,079,513 | 1/1992 | Noguchi et al. ................... 329/304 |
| 5,128,626 | 7/1992 | Iwasaki ................... 329/307 |
| 5,282,228 | 1/1994 | Scott et al. ................... 329/306 |
| 5,341,105 | 8/1994 | Satou ................... 329/308 |
| 5,440,259 | 8/1995 | Yokomura . |
| 5,473,280 | 12/1995 | Ohnishi et al. ................... 329/304 |

FOREIGN PATENT DOCUMENTS

| | | |
|---|---|---|
| 0 297 774 | 1/1989 | European Pat. Off. . |
| 0 409 277 | 1/1991 | European Pat. Off. . |
| 0 517 533 | 12/1992 | European Pat. Off. . |
| WO86/00767 | 1/1986 | WIPO . |

Primary Examiner—Viet Q. Nguyen
Assistant Examiner—Trong Phan
Attorney, Agent, or Firm—Burns, Doane, Swecker & Mathis, L.L.P.

[57] ABSTRACT

A device and a method correct deviation when transferring an information-carrying signal between a transmitter and a receiver. The transmitter can transmit with a plurality of frequencies generated by a voltage-controlled oscillator used for phase demodulation. The receiver demodulates the modulated information-carrying signal. A detector measures the deviation of the modulated information-carrying signal via the information-carrying signal demodulated in the receiver. The frequencies of the demodulated information-carrying signal can be adjusted so that the correct deviation is obtained, and a correct phase demodulation can be carried out.

19 Claims, 4 Drawing Sheets

METHOD AND DEVICE FOR PHASE-MODULATED SIGNALS

This application is a filing under 35 U.S.C. 371 of PCT/SE96/00664 filed on May 22, 1996.

TECHNICAL FIELD

The present invention relates to a method and a device for correcting modulation errors which have arisen in a transmitter of an information-carrying, modulated signal.

BACKGROUND OF THE INVENTION

In information transfer of digital signals over relatively long distances between a transmitting unit and a receiving unit, it is expedient to encode the digital signal in some way. The encoding is carried out in order to guarantee a reliable transfer of information despite interferences. In the case of wire transmission, one of the simplest forms of encoding can be to raise the signal levels, while a more advanced form may be some variant of phase modulation or frequency modulation. The application of optical fibres for information transfer in most cases necessitates the use of a light source modulated by the digital signals.

Transfer of information by wire or by optical fibres is not always possible because of geographical conditions, costs, or other circumstances. In such cases it may be more appropriate to use wireless transmission of the information, for example with the aid of some type of radio wave. In this case too it is expedient to use a carrier wave which is modulated by the digital information.

The three basic methods for modulating digital information are amplitude modulation, frequency modulation and phase modulation. The decision as to which method is used can be based on any one of the following demands and/or requirements: detectivity, data transfer speed, available spectrum bandwidth, hardware complexity, frequency range, cost, etc. A number of these demands/requirements are in direct conflict with each other, for which reason prioritization must be effected depending on the application. Frequency modulation and phase modulation both have a constant envelope, which makes them insensitive to amplitude nonlinearities which may arise in microwave radio links and satellite channels, for example. Consequently, frequency modulation and phase modulation are far more common than amplitude modulation.

Frequency modulation is very often the simplest to put into practice, that is to say the requisite hardware is simple, both at the transmitter end and at the receiver end, which results in low costs. Phase modulation, on the other hand, affords a better system in terms of performance, but it requires a more complicated transmitter and a more complicated receiver. Owing to these differences, types of hybrids have been developed which make use of advantages from both the modulation methods. Examples of these which may be mentioned are TFM (Tamed Frequency Modulation) and C-QPSK (Constant envelope offset Quadrature Phase Shift Key), which are the same method, but whose different names illustrate the fact that they are a hybrid solution. The modulation method consists in using a physically simple transmitter, similar to the one which is used for frequency modulation, and an advanced receiver similar to the one which is used for phase modulation. In this way a system is obtained which has advantages of frequency modulation, i.e. simpler and less expensive, and of phase modulation, i.e. better performance.

The present invention concerns the problems which arise when using such modulation methods in which the transmission signal is generated by means of frequency control by a voltage-controlled oscillator (VCO) and in which the signal is phase-demodulated in the receiver. The use of a voltage-controlled oscillator for generating a phase-modulated transmission signal may entail a simplification of the transmitter in some respects, but it at the same time imposes more stringent demands on the components included.

When different frequencies are used for phase modulation of the information-carrying transmission signal, the demands in respect of the frequencies which the voltage-controlled oscillator generates are extremely stringent if a correct phase demodulation is to take place in the receiver. The demands increase still further in the case of coherent phase demodulation where the phase information over a number of information bits is used for generating a carrier wave frequency in the receiver. The phase error is equal to the time integral of the frequency error.

On generating the frequencies of the transmission signal, use is made of a pulse shaper which converts the information-carrying signal, often a digital bit stream, to a modulating baseband signal which controls the voltage-controlled oscillator. The level of the modulating baseband signal indicates what frequency the transmission signal must have at a certain point. If the pulse shaper has an amplification error, which may be caused by temperature variations, ageing of the components, poor initial setting of levels, etc., this means that the voltage-controlled oscillator receives the incorrect input signal and as a consequence of this will generate incorrect frequencies. As a result of amplification errors, the frequencies which are generated will be scaled by a factor which is in proportion to the amplification error. The scaling means that the width of the frequency spectra, which all the generated frequencies create, will decrease or increase to an extent which corresponds to the scaling.

The scaling can be illustrated in the following way. Let us assume that the desired modulating baseband signal has a range lying between four and eight volts. If the amplification error gives rise to a factor of two, then the input signal to the voltage-controlled oscillator will lie between eight and sixteen volts. The dynamic range has thus not only moved, but has also increased from four to eight volts, and the output signal frequencies have therefore also changed correspondingly. Thus, the frequencies have not all increased to the same extent, and instead the frequencies are scaled in relation to the amplification error. This creates an incorrect deviation of the output signal. Deviation is taken to mean the instantaneous discrepancy in frequency from an imagined centre frequency.

Problems associated with frequency generation can also arise in the voltage-controlled oscillator. That is to say that even in those cases where the modulating baseband signal is correct, the voltage-controlled oscillator can generate the incorrect frequency. The voltage-controlled oscillator may be affected by amplification errors which can be caused by temperature variations, ageing of components, poor initial setting of levels and amplification factors, etc. Here too, the generated frequencies will be scaled by a factor which is in proportion to the amplification error.

A solution to the problems involved in generating frequencies for use in phase modulation with a voltage-controlled oscillator is to provide the transmitter with a detector which measures the deviation of the modulated transmission signal, and thereby to adjust the baseband signal level so that correct frequencies and thus also correct modulation are achieved. To do this, it is necessary in the first place to provide the transmitter with a demodulator which demodulates the transmission signal from the voltage-controlled oscillator. The demodulated transmission signal is then sent to a deviation error detector which detects the magnitude of the amplification error and provides a deviation error constant. The deviation error constant is then used for correcting the baseband signal level.

The solution functions well from a technical point of view, but it is complicated and expensive to implement in practice. The solution requires that the transmitting part also comprises a receiver with a demodulator, which is expensive and takes up a great deal of space, especially so if the centre frequency of the modulated transmission signal is situated within the microwave range or higher.

WO 86/00767 discloses a solution, similar to the one described above, for dealing with deviation errors. In that case too, the solution lies in correcting the transmitted signal by using a complicated device in the transmitter.

SUMMARY OF THE INVENTION

One object of the invention is to make available a method and a device which correct deviation errors which have arisen in the transmitter.

Another object of the invention is to make available a method and a device for simplifying the transmitter in association with the transfer of modulated information signals.

A further object of the invention is to allow the above-mentioned method and device to be implemented in a receiver of the modulated information signals, without any substantial or costly interventions.

According to the invention, the abovementioned objects are achieved by means of a device and a method for transfer of an information-carrying signal which is transmitted by a transmitter which is able to transmit with a plurality of frequencies generated by a voltage-controlled oscillator used for phase demodulation, in which the receiver is provided with a detector which indirectly measures the deviation of the modulated information-carrying signal and in so doing can adjust the frequencies of the demodulated information-carrying signal so that the correct deviation is obtained and a correct phase demodulation can be carried out.

The above objects are furthermore achieved by means of a device according to the invention which, in a receiver, can correct deviation errors in a modulated information-carrying signal having originated in a transmitter, on transfer of an information-carrying signal between the transmitter, where the modulated information-carrying signal is generated with the aid of a voltage-controlled oscillator and the information-carrying signal, and the receiver for coherent phase demodulation which demodulates the transmitted modulated information-carrying signal, preferably with quadrature demodulation, with a demodulated signal being created. The device comprises means for deriving the demodulated signal in order thereby to create an instantaneous frequency value. The device furthermore comprises means for detecting the deviation of the modulated information-carrying signal with the aid of an amplitude-scaled signal and/or a phase signal and in order thereby to create a correcting signal which is related to the detected deviation. The device additionally comprises means for multiplying the instantaneous frequency value with the correcting signal in order thereby to create an amplitude-scaled signal, and means for integrating the amplitude-scaled signal in order thereby to create a phase signal, and, in addition, means for phase-demodulating the phase signal in order to recreate in this way a copy of the information-carrying signal.

Some of the signal processing in the device is expediently carried out digitally, and in that case preferably by means of the fact that the device comprises at least one analog/digital converter which is placed downstream of the demodulator, for example. By doing this, it is possible for all the signal processing in the signal chain downstream of these analog/digital converters to be carried out by completely digital means.

The practical implementation expediently involves the use of one or more integrated circuits which can either be of a standard type or can be application-specific, or a mixture of these two. Another embodiment involves the digital signal processing being effected with the aid of a processor device which can be implemented with the aid of a processor (computing unit) and a program memory and data memory coupled to the processor. The invention becomes even more advantageous when the frequencies for the modulated information-carrying signal lie within the microwave range or higher.

A possible extension of the invention is for information concerning the correcting signal to be fed back to the transmitter of the modulated information-carrying signal via a data channel, for example, and to effect, in the transmitter, an adjustment of the modulated baseband signal, for example.

The above objects are furthermore achieved by means of a method according to the invention, which method can correct, in a receiver, the deviation errors of a modulated information-carrying signal having originated in a transmitter, on transfer of an information-carrying signal between the transmitter, where the modulated information-carrying signal is generated with the aid of a voltage-controlled oscillator and the information-carrying signal, and the receiver for coherent phase demodulation which demodulates the modulated information-carrying signal, preferably with quadrature demodulation, with a demodulated signal being created. The demodulated signal is derived in order to create an instantaneous frequency value. The deviation of the modulated information-carrying signal is thereafter detected, and a correcting signal is created which is related to the detected deviation. The instantaneous frequency value is multiplied with the correcting signal and creates an amplitude-scaled signal. The amplitude-scaled signal is integrated and in this way creates a phase signal which is phase-demodulated in order thereby to recreate a copy of the information-carrying signal.

The deviation can be detected with the aid of the amplitude-scaled signal and/or the phase signal.

Since a large part of the method is carried out digitally, an advantageous implementation of the method may be to implement the, according to the method, digital signal processing in one or possibly several integrated circuit(s) of a standard type or of an application-specific type, or a mixture of these. If the data beat is low, it is also possible to envisage implementing the, according to the method, digital signal processing in a processor device with associated program memory and data memory. The processor device can of course be designed with the aid of a conventional processor or a dedicated signal processor (DSP—Digital Signal Processor).

The method is particularly applicable when the modulated information-carrying signal is situated within the microwave range or higher.

In a further development of the method, it is possible to envisage the correcting signal being fed back to the transmitter of the modulated information-carrying signal, for example via a data channel, in order thereby to correct the deviation.

BRIEF DESCRIPTION OF THE DRAWINGS

The invention will be described below in greater detail for illustrative purposes, not in any way implying limitations, and with reference being made to the attached drawings, in which.

DETAILED DESCRIPTION OF PREFERRED EMBODIMENTS

To illustrate the system according to the present invention, some examples of its application will be described hereinbelow with reference to FIGS. 1 to 4.

Figure 1:
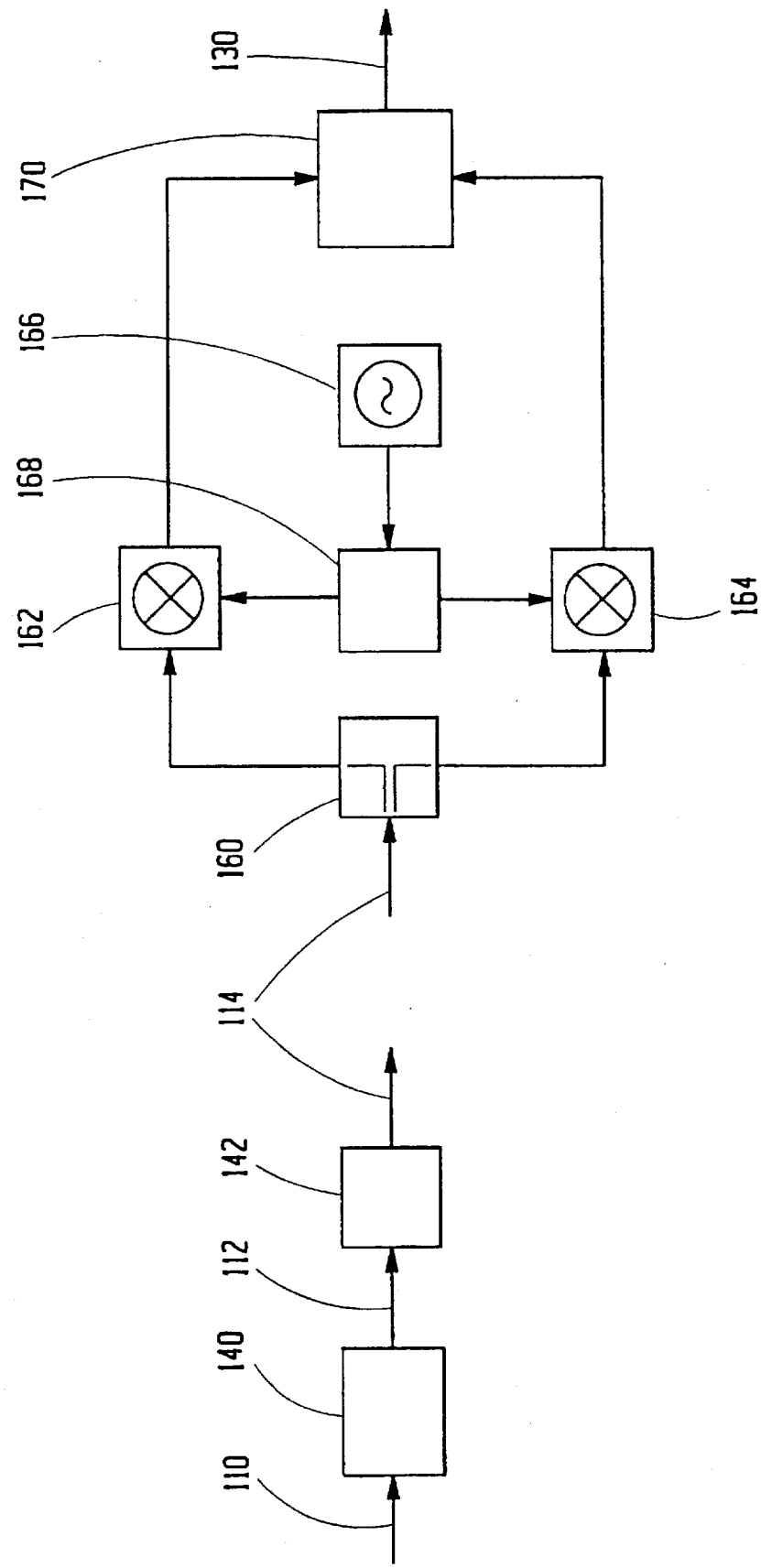
FIG. 1 shows a schematic block diagram of a transfer system in which the present invention can suitably be implemented.

FIG. 1 shows a schematic block diagram of a system for which the present invention is intended. An information-carrying signal 110, which can be a digital bit stream, is converted in a pulse shaper 140 in order to create a modulating baseband signal 112. The modulating baseband signal 112 is envisaged to be adapted so that it can control a voltage-controlled oscillator 142 in such a way that a modulated information-carrying signal 114 has a desired modulation and thus also a desired deviation, so that it can be decoded in a receiver. The transfer of the information-carrying signal can be effected via one or more radio channels, a microwave link, a satellite channel or via some other medium. In the example shown, the receiver consists in part of a quadrature demodulator. The quadrature demodulator comprises a signal divider 160 which divides the modulated information-carrying signal 114 into an I (in-phase) channel and a Q (quadrature phase) channel. The information-carrying signals in the I and Q channels are each demodulated in the respective demodulators 162, 164, which in principle are multipliers which multiply the input signal with a demodulating frequency which is 90° phase-shifted between the channels. The demodulating frequency is generated in a signal generator 166 and it is phase-shifted in a phase shifter 168 in order to feed the demodulators 162, 164 of the I and Q channels. Divided into an I channel and a Q channel, and thereafter demodulated, the demodulated information-carrying signals of the I and Q channels are fed to a data detector 170 which decodes them in order to recreate a copy 130 of the information-carrying signal 110.

As has already been mentioned, it may happen that the level of the modulating baseband signal 112 is not correct, because of amplification errors in the pulse shaper 140, or that amplification errors have arisen in the voltage-controlled oscillator 142, the result of which is that the modulation, the deviation, of the modulated information-carrying signal 114 is incorrect. When errors occur in the modulated information-carrying signal, the data detector 170 will not be able to create a copy 130 of the information-carrying signal 110.

Figure 2:
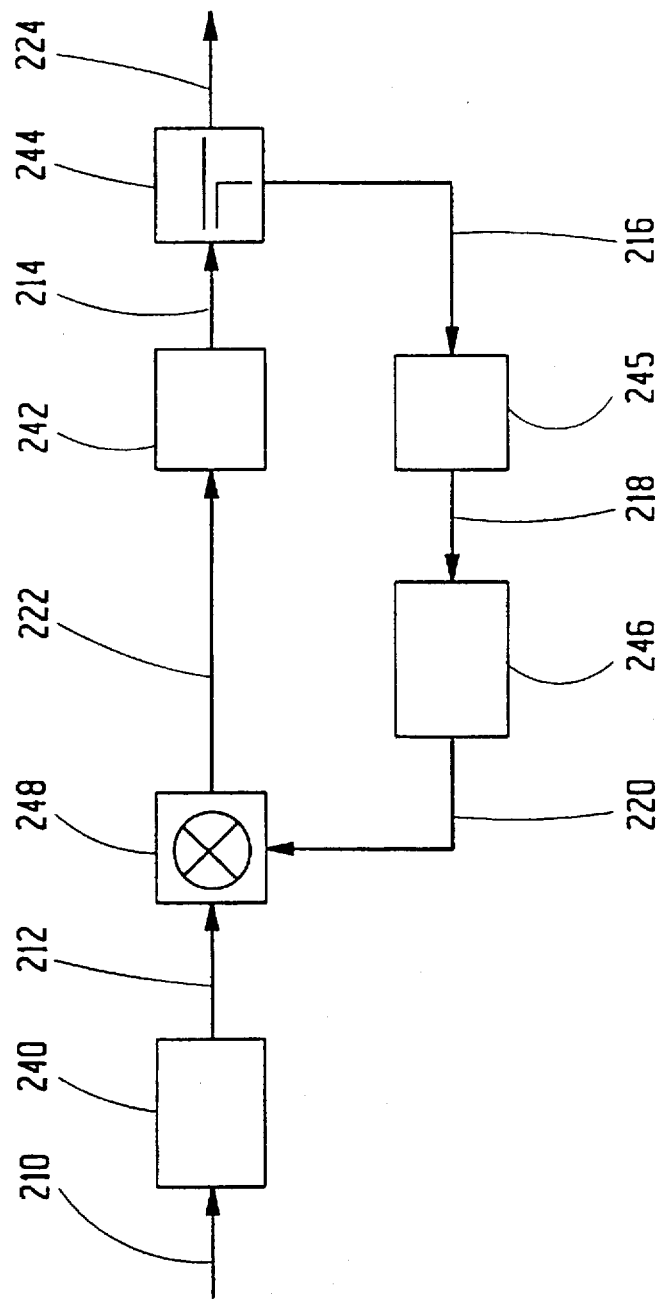
FIG. 2 shows a schematic block diagram of a transmitter with deviation correction.

A solution to these problems is, according to FIG. 2, to correct the baseband signal in the transmitter of the information-carrying signal in order thereby to obtain a correct deviation. Here, an information-carrying signal 210 is converted in a pulse shaper 240 in order to create a modulating baseband signal 212. The modulating baseband signal 212 is multiplied with a correcting signal 220 in order to generate a scaled modulating baseband signal 222 which in turn controls a voltage-controlled oscillator 242 which generates a modulated information-carrying signal 214. The modulated information-carrying signal 214 is divided in the divider 244, one part 224 being sent to a receiver, and one part 216 being demodulated in a demodulator 245 in order to provide the transmitter with a demodulated information-carrying signal 218. The demodulated information-carrying signal 218 is fed into a deviation error detector 246 which measures the deviation of the demodulated information-carrying signal 218, which provides a measure, the correcting signal 220, of how the amplification errors appear in the pulse shaper 240 and the voltage-controlled oscillator 242. Multiplying the correcting signal 220 with the modulating baseband signal 212 gives a modified, or in other words a scaled, modulating baseband signal 222 which controls the voltage-controlled oscillator 242 in such a way that a modulated information-carrying signal 214 with correct deviation is obtained.

This solution functions well from a technical point of view, but it is expensive and takes up a lot of space, especially because of the demodulator 245.

The disadvantages are remedied with the aid of the present invention in a simple and uncomplicated way. The present invention is suitable for use in conjunction with a transmitter according to FIG. 1, whereas it expediently makes use of a receiver according to either of FIGS. 3 and 4.

Figure 3:
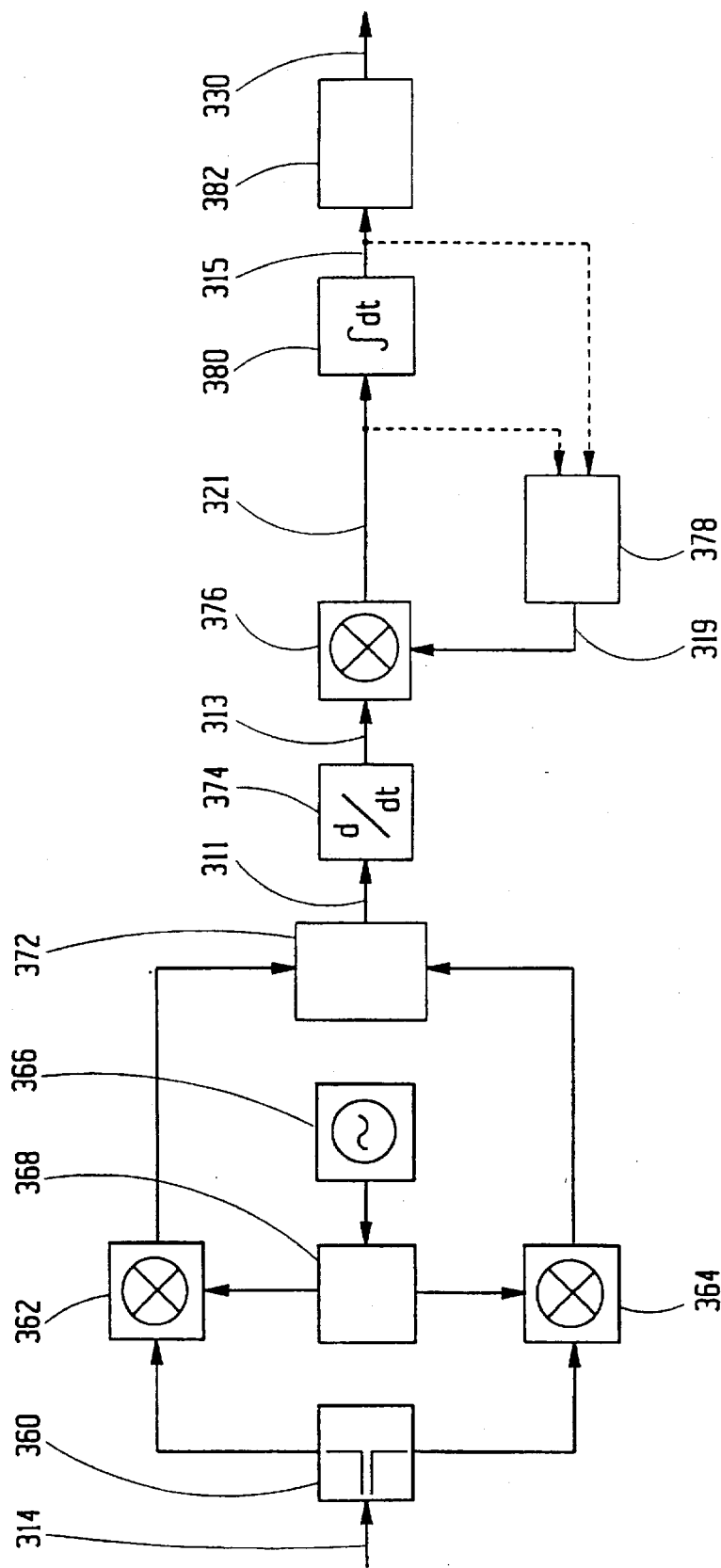
FIG. 3 shows a schematic block diagram of one embodiment of a receiver with deviation correction according to the present invention.

FIG. 3 shows a schematic block diagram of a solution to the problems in accordance with the present invention. A modulated information-carrying signal can be generated in a transmitter of a type which is shown in FIG. 1, where an information-carrying signal 110 is converted in a pulse shaper 140 which in turn controls a voltage-controlled oscillator 142. The modulated information-carrying signal 314 is first demodulated in a demodulator. The demodulator can be a quadrature demodulator similar to that shown in FIG. 1, but it can equally well be of some other type. The modulated information-carrying signal 314 is first divided in a signal divider 360 which divides the modulated information-carrying signal 314 into an I channel and a Q channel. The information-carrying signals in the I and Q channels are demodulated in their respective demodulators 362, 364, which in principle are multipliers which multiply the input signal with a demodulating frequency which is 90° phase-shifted between the channels. The demodulating frequency is generated in a signal generator 366 and it is phase-shifted in a phase shifter 368 in order to feed the demodulators 362, 364 of the I and Q channels. Divided into an I channel and a Q channel and thereafter demodulated, the demodulated information-carrying signals of the I and Q channels are fed to a phase converter 372 which gives an information-carrying phase signal 311. The information-carrying phase signal 311 is differentiated in a differentiator 374 in order to generate an information-carrying frequency signal, an instantaneous frequency value 313. It is necessary to obtain the instantaneous frequency value 313 so as to be able to correct the deviation.

Deviation errors which are corrected using the present invention have arisen as a result of amplification errors in the baseband upon frequency generation of the modulated information-carrying signal 314, for which reason correction is performed on the same type of signal.

The instantaneous frequency value 313 is multiplied in a multiplier 376 with a correcting signal 319 and thus creates a scaled information-carrying frequency signal, an amplitude-scaled signal 321. The amplitude-scaled signal 321 is integrated in an integrator 380 in order to give a scaled information-carrying phase signal, a scaled phase signal 315 which can be phase-demodulated in a phase demodulator 382 which then recreates a copy 330 of the information-carrying signal.

The correcting signal 319 is generated by a deviation error detector 378 which detects the deviation of the modulated information-carrying signal 314 either via the amplitude-scaled signal 321 or the scaled phase signal 315, or both.

By means of this method and this device it is possible to avoid the problems which arise when using deviation correction in the transmitter. This method has additional advantages since it is possible in principle to incorporate the entire receiver, besides the high-frequency parts, in one or more integrated circuits.

Figure 4:
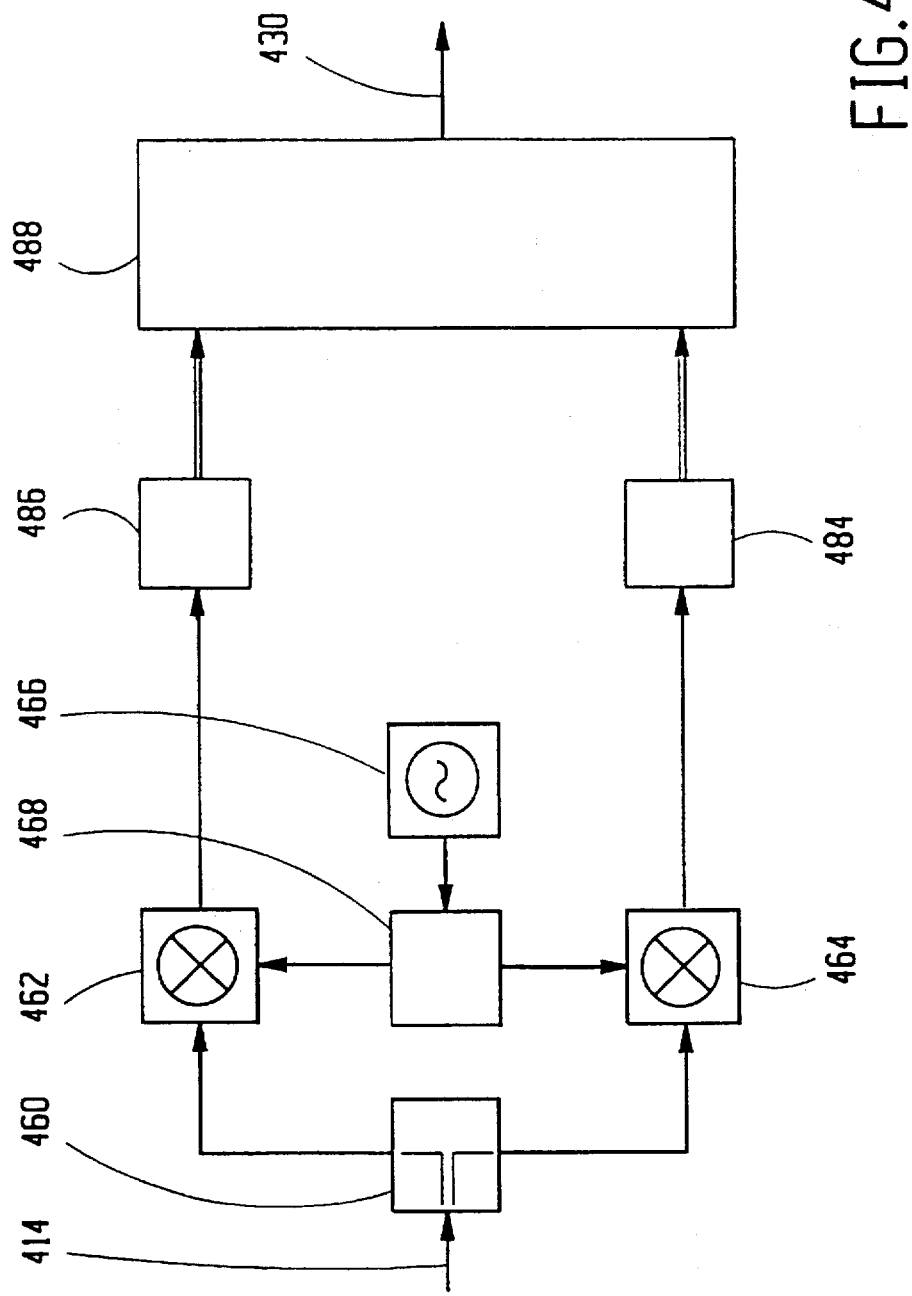
FIG. 4 shows a schematic block diagram of a further embodiment of a receiver with deviation correction according to the present invention.

FIG. 4 shows a schematic block diagram of another embodiment of a receiver with deviation correction according to the present invention. In this embodiment too, a modulated information-carrying signal can be generated in a transmitter of a type which is shown in FIG. 1, where an information-carrying signal 110 is converted in a pulse shaper 140 which in turn controls a voltage-controlled oscillator 142. This figure too shows a quadrature demodulator, although some other demodulator can of course replace it. As before, a modulated information-carrying signal 414 is divided in a divider 460 into an I channel and a Q channel and is demodulated with the aid of the multipliers/demodulators 462, 464, signal generator 466 and phase shifter 468. After the demodulation, the I channel and Q channel are analog/digitally converted in their respective analog/digital converters 484, 486, the digital outlets of which feed a digital ASIC (Application-Specific Integrated Circuit) 488. The analog-to-digital interface can of course be positioned elsewhere. The positioning usually depends only on the available digital technology, but it would be preferable to position the interface as far towards the modulated information-carrying signal 414 as possible, and, in an ideal case, possibly only after some form of receiving amplifier. With current technology, it is best to position the interface downstream of the demodulation.

The digital application-specific circuit 488 comprises most of the functions from FIG. 3, that is to say the functions for a phase converter 372, a differentiator 374, a multiplier 376, an integrator 380, a phase demodulator 382 and a deviation error detector 378. The circuit generates as an output signal at least one copy of the information-carrying signal 110.

The digital application-specific circuit 488 can of course consist of a number of application-specific circuits or a number of standard circuits, or a mixture of application-specific and standard circuits. In those cases where the modulation methods and the data transfer speed permit, the digital application-specific circuit 488 can of course be replaced by one or possibly several processor device(s). A processor device usually consists of one or more computing units (the processor), memory elements for both program and data, and in addition some types of input and output units.

A possible extension of the invention is for information concerning the correcting signal to be fed back to the transmitter of the modulated information-carrying signal via a data channel for example, where the majority of the communication links are bidirectional (full duplex), and to adjust the modulated baseband signal in the transmitter. The adjustment can be carried out by means of the transmitter being provided with a multiplier in accordance with that shown in FIG. 2, but which is supplied with a signal which has been digital/analog converted from data which has been sent from the receiver deviation detector. Here it is possible to envisage data concerning deviation errors being sent to the transmitter where a rough adjustment is made, and the fine adjustment still being made in the receiver.

The invention is not limited to the abovementioned embodiments, but can be varied within the scope of the patent claims which follow.

What is claimed is:

1. In a receiver, a device for correcting errors in a modulated information-carrying signal generated from an information-carrying signal by a transmitter having a voltage-controlled oscillator, wherein the receiver generates a demodulated signal from the modulated information-carrying signal by phase demodulation, the device comprising:

means for differentiating the demodulated signal to generate an instantaneous frequency value;

means for detecting a deviation of the modulated information-carrying signal and generating a correcting signal related to a detected deviation;

means for multiplying the instantaneous frequency value by the correcting signal to generate an amplitude-scaled signal;

means for integrating the amplitude-scaled signal to generate a scaled phase signal; and means for phase-demodulating the scaled phase signal to generate a copy of the information-carrying signal.

2. The device of claim 1, wherein the demodulated signal is generated by quadrature demodulation of the modulated information-carrying signal.

3. The device of claim 2, wherein the detecting means detects the deviation based on the amplitude-scaled signal.

4. The device of claim 2, wherein the detecting means detects the deviation based on the scaled phase signal.

5. The device of claim 2, wherein the detecting means detects the deviation based on the amplitude-scaled signal and the scaled phase signal.

6. The device of claim 1, wherein the modulated information-carrying signal has a frequency in the microwave range or higher.

7. The device of claim 1, further comprising means for analog/digital conversion of the demodulated signal, wherein the differentiating means, multiplying means, integrating means, and phase-demodulating means are implemented by at least one integrated circuit.

8. The device of claim 1, further comprising means for analog/digital conversion of the demodulated signal, wherein the differentiating means, multiplying means, integrating means, and phase-demodulating means are implemented by a digital signal processor comprising a computing device and memory elements.

9. The device of claim 1, further comprising means for feeding information concerning the correcting signal back to the transmitter.

10. A system for correcting in a receiver deviation errors in a modulated information-carrying signal generated from an information-carrying signal by a transmitter using a voltage-controlled oscillator, the receiver phase demodulating the modulated information-carrying signal having a frequency in the microwave range or higher and generating a demodulated signal for correcting the deviation errors having arisen in the transmitter, the system comprising:

means for analog/digital converting the demodulated signal;

means for differentiating the converted, demodulated signal to generate an instantaneous frequency value;

means for detecting a deviation of the modulated information-carrying signal and generating a correcting signal related to a detected deviation;

means for multiplying the instantaneous frequency value by the correcting signal to generate an amplitude-scaled signal;

means for integrating the amplitude-scaled signal to generate a scaled phase signal; and means for phase-demodulating the scaled phase signal to generate a copy of the information-carrying signal;

wherein the detecting means detects the deviation based on at least one of the scaled phase signal and the amplitude-scaled signal, and the differentiating means, multiplying means, integrating means, and phase-demodulating means are implemented by at least one integrated circuit.

11. In a receiver, a method of correcting errors in a modulated information-carrying signal generated from an information-carrying signal by a transmitter having a voltage-controlled oscillator, wherein the receiver generates a demodulated signal from the modulated information-carrying signal by phase demodulation, the method comprising the steps of:

differentiating the demodulated signal to generate an instantaneous frequency value;

detecting a deviation of the modulated information-carrying signal and generating a correcting signal related to a detected deviation;

multiplying the instantaneous frequency value by the correcting signal to generate an amplitude-scaled signal;

integrating the amplitude-scaled signal to generate a scaled phase signal; and phase-demodulating the scaled phase signal to generate a copy of the information-carrying signal.

12. The method of claim 11, wherein the demodulated signal is generated by quadrature demodulation of the modulated information-carrying signal.

13. The method of claim 12, wherein the amplitude-scaled signal is used in detecting the deviation of the modulated information-carrying signal.

14. The method of claim 12, wherein the scaled phase signal is used in detecting the deviation of the modulated information-carrying signal.

15. The method of claim 12, wherein the amplitude-scaled signal and the scaled phase signal are used in detecting the deviation of the modulated information-carrying signal.

16. The method of claim 11, wherein the modulated information-carrying signal has a frequency in the microwave range or higher.

17. The method of claim 11, further comprising the step of analog/digital converting the demodulated signal, wherein the steps of differentiating, multiplying, integrating, and phase-demodulating are implemented by at least one integrated circuit.

18. The method of claim 11, further comprising the step of analog/digital converting the demodulated signal, wherein the steps of differentiating, multiplying, integrating, and phase-demodulating are implemented by a digital signal processor comprising a computing device and memory elements.

19. The method of claim 11, wherein information concerning the correcting signal is fed back to the transmitter via a data channel.

* * * * *